United States Patent

[11] 3,573,631

[72] Inventor David J. Carlson
Indianapolis, Ind.

[21] Appl. No. 756,620
[22] Filed Aug. 30, 1968
[45] Patented Apr. 6, 1971
[73] Assignee RCA Corporation

[54] OSCILLATOR CIRCUIT WITH SERIES RESONANT COUPLING TO MIXER
9 Claims, 2 Drawing Figs.

[52] U.S. Cl. .......... 325/439, 325/464, 334/15
[51] Int. Cl. .......... H03j 3/18, H04b 1/28, H04n 5/44
[50] Field of Search .......... 325/439, 464, 470; 334/15

[56] References Cited
UNITED STATES PATENTS

| | | | |
|---|---|---|---|
| 980,358 | 1/1911 | Squier .......... | 179/2.5 |
| 3,040,255 | 6/1962 | Mukai .......... | 325/439 |
| 3,391,347 | 7/1968 | Bosse .......... | 334/15 |
| 3,437,934 | 4/1969 | Pawlowski .......... | 325/439 |

*Primary Examiner*—Bernard Konick
*Assistant Examiner*—Howard W. Britton
*Attorney*—Eugene M. Whitacre

ABSTRACT: An oscillator circuit tuned by a voltage dependent variable capacitance diode is coupled to a mixer stage by a wide band injection circuit which includes a series connected inductor and capacitor adapted to series resonate at a frequency within the oscillator tuning range. A resistor interconnects the voltage dependent variable capacitance diode and a tuning bias potential supply. The resistor is of a value to cause the tuning of the oscillator circuit to track the tuning of the other circuits controlled by the bias supply.

Patented April 6, 1971 3,573,631

Figures 1, 2:
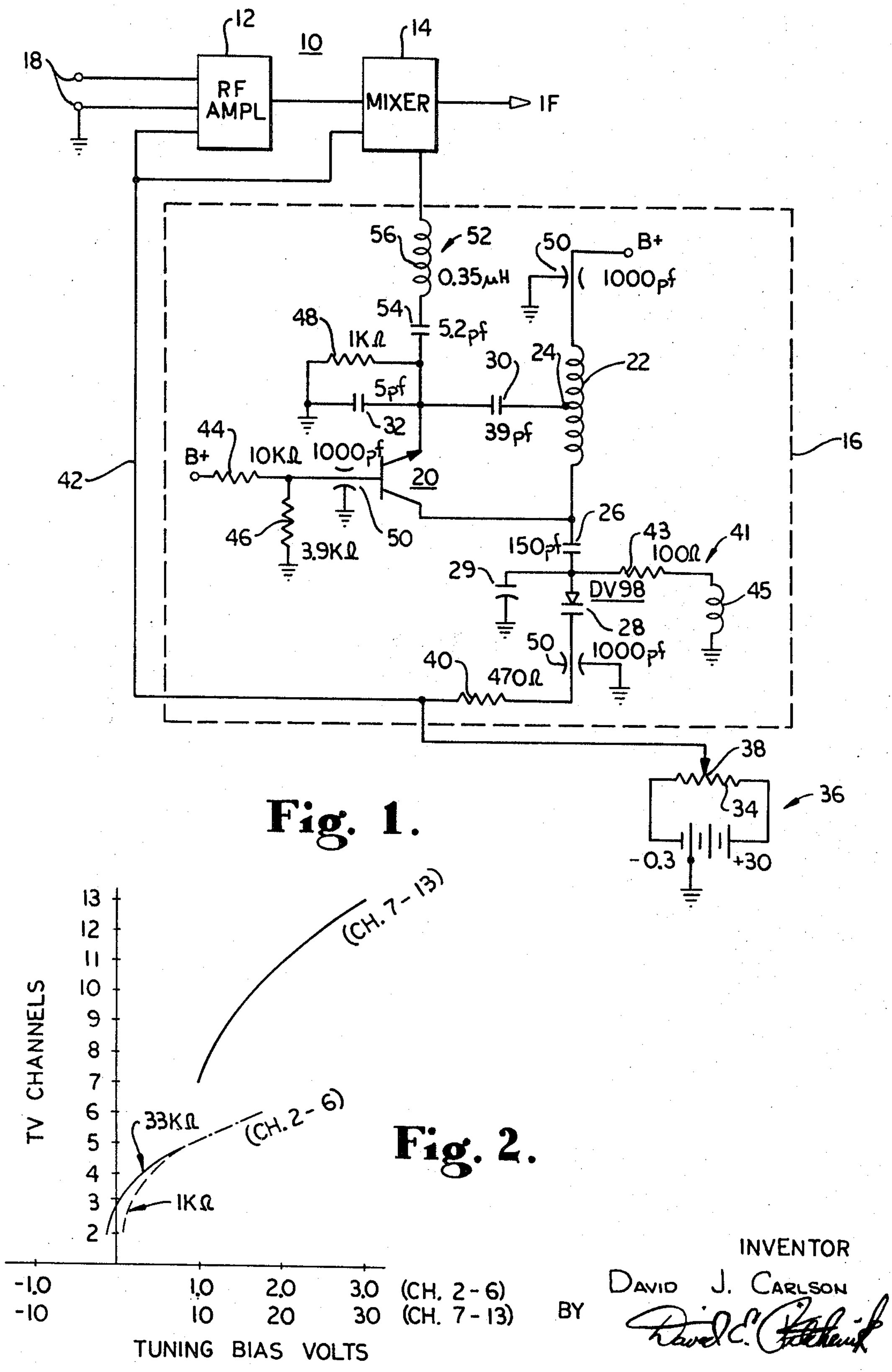

INVENTOR
DAVID J. CARLSON
BY
David E. [signature]
Attorney

OSCILLATOR CIRCUIT WITH SERIES RESONANT COUPLING TO MIXER

This invention relates to an oscillator tunable over a wide frequency range, and more particularly, to a wide band electrically tunable oscillator for signal-modulated wave receivers.

In a heterodyne-receiver system employing wideband capacitively tuned oscillators, the available output power from the oscillator tank circuit may be reduced at both the low and the high end of the oscillator frequency band. Under these conditions, it becomes desirable to provide an injection circuit coupling the oscillator tank circuit and the mixer stage such that uniform injection current is obtained at the extreme ends of the frequency band.

The use of voltage dependent variable capacitance diodes (varicap diodes) as the capacitor tuning element in the oscillator tank circuit may add to the power problem at the low end of the frequency band when the diode is biased to display maximum capacitance. Because of the bias conditions required for the varicap diode, the diode may become conductive, with a resultant power loss in the series resistance associated with the diode. This power loss further reduces the available power from the oscillator tank circuit. Moreover, at this time, the diode may be operating in a nonlinear region of its capacitance-bias characteristic which makes the low end tuning of the oscillator difficult. In addition, when the oscillator tank circuit and the signal selection circuits are controlled from the same bias supply a tracking problem may arise since the oscillator and the signal selection resonant circuits are tuned to different frequencies which are separated by the intermediate frequency.

An oscillator embodying the present invention includes a transistor with tuning circuit means coupled to one of its electrodes to tune the oscillator in a desired band of frequencies. An injection circuit having a serially connected capacitor and inductor series resonant at a frequency within the desired band of frequencies interconnects the mixer stage and the oscillator.

In accordance with one feature of the invention, the tuning circuit means which is coupled to the transistor includes a voltage dependent variable capacitance diode. The diode is biased from a source of tuning bias potential supply and is conductive over a portion of the desired band of frequencies. A resistor interconnects the voltage dependent variable capacitance diode and the tuning bias potential supply such that when the diode is conductive a voltage is established across the resistor of a polarity that opposes the tuning bias potential to aid the tuning of the oscillator circuit to track with the tuning of other circuits controlled from the bias supply.

A complete understanding of the invention may be obtained from the following detailed description, when taken in conjunction with the accompanying drawings, in which:

FIG. 1 is a schematic circuit diagram partly in block form of a television tuner embodying the invention; and FIG. 2 is a graph of the oscillator frequency, in terms of television channels, as a function of the voltage dependent variable capacitance tuning supply potential for two different values of bias source impedance.

Reference is now made to FIG. 1. A television tuner 10 includes an RF amplifier stage 12, a mixer stage 14 and a local oscillator stage 16. Radio frequency signals applied at antenna terminals 18 are amplified by the RF amplifier 12 and fed to the mixer stage 14. The local oscillator stage 16 supplies locally generated signals to the mixer 14 wherein the amplified RF signal and the locally generated oscillator signal are heterodyned to produce an intermediate frequency (IF) signal. The local oscillator stage 16 includes a transistor 20 which has a tunable resonant circuit connected to its collector electrode. Included in the resonant circuit are an inductor 22 with a tap connection 24, a capacitor 26, a voltage dependent variable capacitance diode 28 and a trimmer capacitor 29. Two capacitors 30 and 32 are serially connected between the inductor tap 24 and a point of reference potential, shown as ground. The junction of the capacitors 30 and 32 is connected to the emitter electrode of the transistor 20. The capacitor 30 provides a regenerative feedback path between the oscillator tank circuit and the emitter electrode of the transistor, while the capacitor 32 helps to prevent the oscillator from oscillating in a parasitic mode by shorting to ground any high frequency signals appearing at the emitter electrode of the transistor 20. The capacitors 30 and 32 also divide down the voltage developed at the tap connection 24. Utilization of the inductor tap connection 24 provides a better impedance match at the emitter electrode of the oscillator transistor 20 for the desired regenerative feedback.

A diagrammatically represented tuning bias potential supply 36 for the diode 28 includes a resistor 34. The resistor has a variable tap 38 for setting the potential on the diode 28. The tap 38 and the cathode of the diode 28 are interconnected by a resistor 40. A lossy choke 41, shown as a resistor 43 and an inductor 45, completes the diode bias circuit by interconnecting the anode of the diode 28 and the ground. The tuning bias potential supply is connected to the RF amplifier stage 12 and the mixer stage 14 by a lead 42 to provide a voltage for controlling voltage dependent variable capacitance diodes (now shown) in the signal selection circuit of the RF amplifier stage 12 and the mixer stage 14.

DC bias for the oscillator transistor is obtained from a source of operating potential B+. The base electrode of the transistor 20 is connected to the source of operating potential by a resistor 44 which in conjunction with a resistor 46 form a voltage dividing network. A resistor 48 interconnects the emitter electrode of the transistor 20 and the ground to provide DC degeneration. The collector electrode of the oscillator transistor 20 is connected to the source of operating potential by the inductor 22. Several feedthrough capacitors 50 bypass RF signals to the ground thereby completing the RF paths in the oscillator circuit.

Since the oscillator 16 is capacitively tuned, at the low end of the frequency band, where maximum capacitance is present in the oscillator tank circuit, the impedance of the tank circuit is at a minimum. Consequently, the voltage which is developed across the tank circuit is also at a minimum and less output power from the oscillator tank circuit is available. The use of the voltage dependent variable capacitance diode 28 as the capacitive tuning elements adds to the power problem at the low end of the frequency band by possible loading.

To obtain the the required range of capacitance to tune the oscillator 16 across a wide frequency range, the reverse bias on the diode is adjusted to a minimum and in some cases, it may be desirable to provide a small external forward bias which is less than the junction potential of the diode 28 for maximum diode capacitance. Under these conditions, the positive voltage swing at the anode of the diode 28 may be such that the reverse bias on the diode is exceeded and the diode becomes conductive. If the diode becomes conductive, there is a power loss in the internal resistance associated with the diode which further reduces the available power from the oscillator tank circuit.

When the bias on the variable capacitance diode 28 is adjusted to cause the oscillator 16 to oscillate at the high end of the frequency band, there may be a reduction in the available output power from the oscillator tank circuit. This oscillator power reduction at the high of the frequency band is due to a rolloff in gain of the transistor 20 at higher frequencies. Consequently, there is a reduction in available output power from the oscillator tank circuit at both the low and high end of the frequency band. It is therefore desirable to provide an injection circuit coupling the oscillator tank circuit and the mixer stage which will provide uniform injection current at both ends of the frequency band.

An injection circuit 52 interconnects the mixer stage 14 and the local oscillator stage 16. Specifically, the injection circuit 52 includes a capacitor 54 and an inductor 56 serially connected between the emitter electrode of the transistor 20 and the mixer stage 14. The injection circuit 52 provides a decoupling between the oscillator stage 16 and the mixer stage 14 so that the oscillator does not become loaded by the mixer stage 14 to the point that it will cease to oscillate and, in addition, prevents interaction between the RF amplifier and mixer circuits with the local oscillator circuit. However, the injection circuit 52 must not decouple the local oscillator stage 16 from the mixer stage 14 to the point that insufficient injection current is provided to the mixer stage at either end of the frequency band. Utilizing a reactive coupling which is purely capacitive or purely inductive results in a nonuniform coupling between the local oscillator and the mixer stage throughout the desired frequency band. If the injection circuit is purely inductive, the greatest decoupling would occur at the highest frequency in the desired frequency band where there is a reduction in the available oscillator output power; and if the injection circuit is purely capacitive, the greatest decoupling would occur at the lowest frequency in the desired frequency band where there also is a reduction in the available oscillator output power. Thus, the degree of coupling provided by a purely inductive or capacitive injection circuit between the local oscillator stage 16 and the mixer stage 14 would be dependent upon the operating frequency of the local oscillator.

In VHF television, for proper heterodyne action, the oscillator must generate a signal ranging in frequency between 101 MHz and 257 MHz. This very wide range in frequency, 156 MHz, where capacitive tuning is employed, can make the reduction in available output power at both ends of the frequency band quite pronounced. However, in the VHF television frequency band, there is a gap between the frequency designated for channel 6 and the frequency designated for channel 7. The frequency for channels 2 to 6 range from 54 MHz to 88 MHz, and the frequency for channels 7 to 13 range from 174 MHz to 216 MHz. Consequently, in the TV receiver there is a frequency gap between the lowest and highest frequency that the local oscillator must generate. Thus, for proper heterodyne action at channel 6, the local oscillator should generate a frequency of 129 MHz and for proper heterodyne action at channel 7, the local oscillator should generate a frequency of 221 MHz. Taking advantage of the gap in necessary local oscillator frequencies, the injection circuit 52 can be apportioned to be series resonant within the frequency gap.

The capacitor 54 and the inductor 56 of the injection circuit may be selected to provide series resonance and consequently low impedance at approximately 150 MHz which is within the unused portion of the local oscillator frequency band. The frequency resonance may, however, be adjusted to be higher or lower to compensate for design variations in the tuner. The injection circuit provides essentially uniform injection current at the frequencies required for channels 2 and 13 which are at opposite ends of the band where reduced oscillator output power is available. In this manner, variations in coupling between the local oscillator stage 16 and the mixer stage 14 are diminished at either end of the desired frequency band by having the injection circuit impedance vary from low impedance at the center of the band to a higher impedance at both the low and high end of the band. In other words, the injection circuit coupling is made less dependent upon frequency variations and provides a more uniform coupling throughout the desired frequency band because the frequency dependency of the coupling is split between the low and high end of the band.

The inductor 56, the capacitor 54 and the capacitor 32 provide a series connection between the mixer stage 14 and the ground. As previously indicated, the inductor 56 and the capacitor 54 are selected to be series resonant at an unused frequency within the desired frequency band of the local oscillator. However, the value of capacitance for the capacitor 32 can be chosen such that the series circuit between the mixer 14 and the ground can be utilized as a trap for any frequency above the frequency at which the inductor 56 and the capacitor 54 are series resonant.

As previously indicated, the tuned circuit of the local oscillator must resonate for any given TV channel at a higher frequency than the signal selection circuits of the RF amplifier and the mixer stages. Thus, if similar type variable capacitance diodes are employed in the resonant tuned circuits of the different stages and unicontrol tuning is to be achieved, it becomes desirable for tracking purposes to change the ratio of the capacitance variation per change in tuning bias voltage for the local oscillator 16 as opposed to the other stages. Inclusion of the capacitor 26 in series with the voltage dependent variable capacitor diode 28 lowers the total capacitance in the local oscillator tunable resonant circuit and is one means of making the oscillator voltage dependent variable capacitance diode track with the RF circuits. In particular, the capacitor 26 lowers the capacitance displayed by the leg of the resonant circuit which includes the voltage dependent variable capacitance diode 28. This results in the local oscillator tunable resonant circuit being resonant at a higher frequency for any given setting of the tuning bias potential as is necessary for the proper heterodyne action in the mixer stage 14.

Additional tracking between the local oscillator stage 16 and other stages of the tuner is achieved at the lower end of the frequency band by taking advantage of the conduction of the voltage dependent variable capacitance diode 28. The diode 28 becomes conductive when the positive voltage swing at its anode exceeds the voltage at its cathode which is applied from the tap connection 38 through the resistor 40. The current which flows through the diode 28 because of the positive voltage swing sets up a voltage across the resistor 40 of a polarity which opposes the applied tuning bias potential. Consequently, the voltage at the cathode of the diode 28 is less than the voltage at the tap 38 by the amount of voltage developed across resistor 40. This occurs in the nonlinear region of the diode capacitance-bias characteristic and tends to make the tuning of the oscillator tank circuit more linear.

FIG. 2 shows a graph of the oscillator frequency, in terms of VHF television channels, as a function of the varicap diode 28 tuning supply potential at the tap 38 for two different values of resistance for resistor 40. The tracking effect associated with the resistor 40 occurs at the low voltage, low frequency portion of the curve, and the value of resistance for the resistor 40 may be varied to shape the curve as desired. As the resistance of the resistor 40 increases, a greater voltage is developed across the resistor and the change of voltage at the cathode of the diode 28 as a result of an adjustment of the tap 38 becomes more gradual. This, in turn, causes the capacitance variation per change in tuning supply potential over the lower end of the frequency band to contribute to the tracking of the oscillator's resonant circuit with other circuits controlled by the supply.

I claim:

1. In a television tuner tunable over a desired band of frequencies and including a mixer stage, an oscillator comprising:

a transistor having a first electrode, a second electrode, and a control electrode;

a source of operating potential;

circuit means interconnecting the first electrode and the control electrode of said transistor with said source of operating potential;

a source of tuning bias potential;

tunable circuit means coupled to the first electrode of said transistor, including a voltage dependent variable capacitance diode which is conductive over a portion of said desired band of frequencies;

a resistor interconnecting said voltage dependent variable capacitance diode and said tuning bias potential such that when said diode is conductive, a voltage is established across said resistor of a polarity that opposes the tuning bias potential; and an injection circuit interconnecting said mixer stage and said oscillator including a serially connected capacitor and inductor series resonant at a frequency within said desired band of frequencies.

2. In a television tuner tunable over a desired band of frequencies and including a mixer stage, an oscillator comprising:

an oscillator transistor;
a source of operating potential;
circuit means interconnecting said transistor with said source of operating potential;
tunable circuit means coupled to said transistor; and
an injection circuit interconnecting said mixer stage and said oscillator including a serially connected capacitor and inductor series resonant at a frequency within said desired band of frequencies.

3. An oscillator as defined in claim 2 wherein said series connected capacitor and inductor are series resonant at a frequency within a band of frequencies ranging from 88 MHz to 174 MHz.

4. An oscillator as defined claim 2 wherein said series connected capacitor and inductor are series resonant at an unused frequency within said band of desired frequencies.

5. An oscillator as defined in claim 4 further including a capacitor connected between said injection circuit and a point of fixed reference potential, said capacitor and said injection circuit forming a series resonant circuit between said mixer stage and said point of fixed reference potential which is resonant at a frequency above the frequency at which said injection circuit is series resonant.

6. In a television tuner tunable over a desired band of frequencies and including a mixer stage, an oscillator comprising:
a transistor having a first electrode, a second electrode and a control electrode;
a source of operating potential;
circuit means interconnecting the first electrode and the control electrode of said transistor with said source of operating potential;
a source of tuning bias potential;
tunable circuit means coupled to the first electrode of said transistor, including a voltage dependent variable capacitance diode;
means interconnecting said voltage dependent variable capacitance diode and said tuning bias potential; and
an injection circuit interconnecting said mixer stage and the second electrode of said transistor, said injection circuit including a serially connected capacitor and inductor series resonant at a frequency within a band of frequencies ranging from 88 MHz to 174 MHz.

7. An oscillator as defined in claim 6 further including a capacitor connected between said injection circuit and a point of fixed reference potential, said capacitor and said injection circuit forming a series resonant trap circuit between said mixer stage and said point of fixed reference potential which is series resonant at a frequency above the frequency at which said injection circuit is series resonant.

8. In a television tuner tunable over a desired band of frequencies and including a mixer stage, an oscillator comprising:
a transistor having an emitter electrode, a collector electrode and a base electrode;
a source of operating potential;
circuit means interconnecting the collector electrode and the base electrode of said transistor with said source of operating potential;
tunable circuit means coupled to the collector electrode of said transistor; and
an injection circuit interconnecting said mixer stage and the emitter electrode of said transistor, said injection circuit including a serially connected capacitor and inductor series resonant at a frequency within a band of frequencies ranging from 88 MHz to 174 MHz.

9. An oscillator as defined in claim 8 wherein said tunable circuit means includes a voltage dependent variable capacitance device.